United States Patent [19]

Kondoh

[11] Patent Number: 5,555,278
[45] Date of Patent: Sep. 10, 1996

[54] SEMICONDUCTOR CIRCUIT HAVING PHASE LOCK FUNCTION

[75] Inventor: Harufusa Kondoh, Hyogo-ken, Japan

[73] Assignee: Mitsubishi Denki Kabushiki Kaisha, Tokyo, Japan

[21] Appl. No.: 420,400

[22] Filed: Apr. 11, 1995

Related U.S. Application Data

[63] Continuation of Ser. No. 118,814, Sep. 10, 1993, abandoned.

[30] Foreign Application Priority Data

Sep. 21, 1992 [JP] Japan ..................... 4-251426

[51] Int. Cl.$^6$ ................................ H03D 3/24
[52] U.S. Cl. ................. 375/376; 331/DIG. 2; 327/156; 375/373
[58] Field of Search ................... 375/224, 226, 375/371, 373, 375, 376; 331/1 A, 1 R, 17, 25, 4, DIG. 2; 327/147, 150, 156, 159

[56] References Cited

U.S. PATENT DOCUMENTS

| | | | |
|---|---|---|---|
| 5,008,635 | 4/1991 | Hanke et al. | 331/DIG. 2 |
| 5,075,640 | 12/1991 | Miyazawa | 331/10 |
| 5,109,285 | 4/1992 | Koga | 358/337 |
| 5,126,690 | 6/1992 | Bui et al. | 331/DIG. 2 |
| 5,327,103 | 7/1994 | Baron et al. | 331/DIG. 2 |
| 5,375,148 | 12/1994 | Parker et al. | 375/376 |

FOREIGN PATENT DOCUMENTS

| | | |
|---|---|---|
| 64-24630 | 1/1989 | Japan . |
| 1-129614 | 5/1989 | Japan . |
| 2-284521 | 11/1990 | Japan . |
| 3-159318 | 7/1991 | Japan . |
| 3-206725 | 9/1991 | Japan . |

*Primary Examiner*—Stephen Chin
*Assistant Examiner*—Don Vo
*Attorney, Agent, or Firm*—Lowe, Price, LeBlanc & Becker

[57] ABSTRACT

Jitter provided from a phase locked loop circuit is extracted by pulse extracting circuits. Determination is made by a counter whether a pulse signal representing the jitter reaches a predetermined number within a predetermined time period. An evaluation signal representing the level of the jitter is provided from a thermometer decoder according to the determination result.

8 Claims, 9 Drawing Sheets

(a) LSB 0
      0
      0     → 000
   MSB 0

(b) LSB 1
      0
      0     → 001
   MSB 0

(c) LSB 1
      1
      0     → 010
   MSB 0

(d) LSB 1
      1
      1     → 011
   MSB 0

(e) LSB 1
      1
      1     → 100
   MSB 1

FIG. 10

$$\alpha = A \cdot \overline{B} \cdot \overline{C} \cdot \overline{D} + A \cdot B \cdot C \cdot \overline{D}$$
$$= A \cdot \overline{D}(\overline{B} \cdot \overline{C} + \overline{B} \cdot \overline{C})$$
$$= A \cdot \overline{D} \cdot (\overline{B \oplus C})$$

$$\beta = A \cdot B \cdot \overline{C} \cdot \overline{D} + A \cdot B \cdot C \cdot \overline{D}$$
$$= A \cdot B \cdot \overline{D} \cdot (\overline{C} + C)$$
$$= A \cdot B \cdot \overline{D}$$

$$\gamma = A \cdot B \cdot C \cdot D$$

FIG.11 PRIOR ART

SEMICONDUCTOR CIRCUIT HAVING PHASE LOCK FUNCTION

This application is a continuation of application Ser. No. 08/118,814 filed Sep. 10, 1993 now abandoned.

BACKGROUND OF THE INVENTION

1. Field of the Invention

The present invention relates to semiconductor circuits formed on a semiconductor chip, and more particularly, to a semiconductor circuit having a phase lock function.

2. Description of the Background Art

Recently, the operation in LSIs (Large Scale Integrated circuits) is increased in speed. However, delay in the internal clock signal of a LSI has become noticeable in accordance with the increase in speed of operation. This delay in an internal clock signal will retard the increase in speed of a LSI. To solve this delay in an internal clock signal, a PLL (Phase Locked Loop) circuit is formed on a LSI semiconductor chip. This PLL circuit carries out control such that the phase of an internal clock signal is locked to a reference value of a phase of an external clock signal so that an internal clock signal is generated in a phase identical to that of external clock signal. Also, a circuit formed on said semiconductor chip is known for detecting the locked state of the above-described PLL circuit. Such a locked detection circuit is disclosed in, for example, Japanese Patent Laying-Open Nos. 64-24630, 2-284521, 1-129614, 3-159318 and 3-206725.

Figure 11:
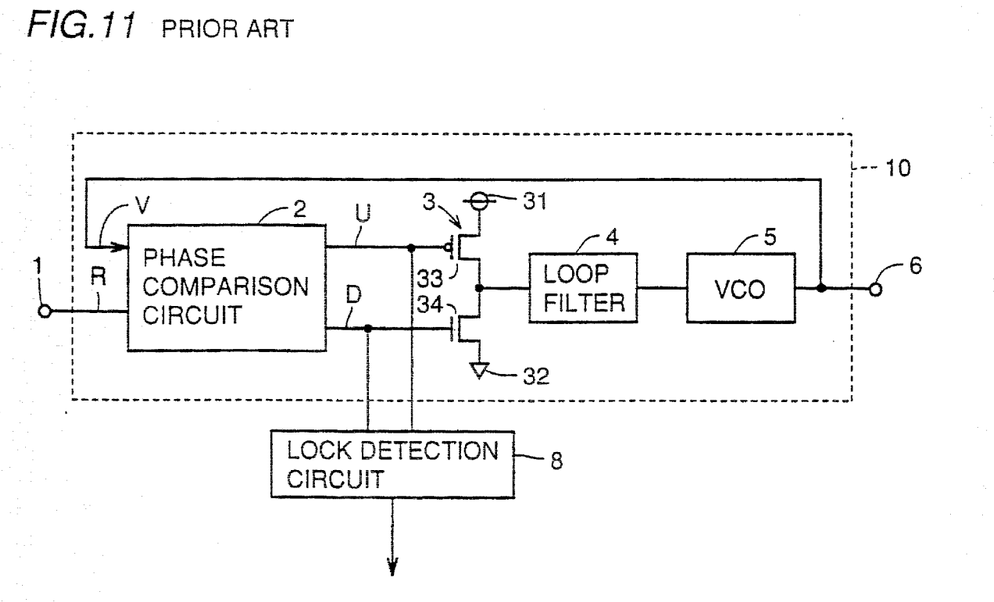
FIG. 11 is a block diagram showing a structure of a conventional locked detection circuit and a PLL circuit.

FIG. 11 is a block diagram showing a structure of a conventional locked detection circuit and a PLL circuit.

The structure of a PLL circuit 10 will first be described. Referring to FIG. 11, a phase comparison circuit 2 is supplied with a reference input signal R from an input terminal 1 and a feedback signal V from a VCO (Voltage Control Oscillator) 5. Phase comparison circuit 2 compares the phase of reference input signal R with that of feedback signal V to provide an up signal U (a low level signal) and a down signal D (a high level signal) which are pulse signals having a pulse width according to the phase difference to match the phases of these signals. Up signal U is a signal to advance the phase of an output signal of VCO 5, and down signal D is a signal for delaying the phase of an output signal of VCO 5.

A charge pump 3 is formed of a PMOS transistor 33 and an NMOS transistor 34 connected in series between a power supply potential 31 receiving a power supply voltage and a ground terminals 32. In charge pump 3, an up signal U is supplied to the gate of PMOS transistor 33 from phase comparison circuit 2, and a down signal D is supplied to the gate of NMOS transistor 34 from phase comparison circuit 2. Charge pump 3 transforms the up and down signals U and D into a voltage pulse by the operation of PMOS transistor 33 and NMOS transistor 34. The voltage pulse is supplied to a loop filter 4.

Loop filter 4 integrates the voltage pulse provided from charge pump 3 to supply the same to VCO 5. VCO 5 functions to change the oscillation frequency according to the output voltage of loop filter 4. When an up signal U is provided, the oscillation frequency is raised to advance the phase of the output signal. When a down signal D is provided, the oscillation frequency is lowered to delay the phase of the output signal. The output signal of VCO 5 is provided from output terminal 6 and also fed back to phase comparator 2.

PLL circuit 10 of the above-described structure has a locked detection circuit 8 connected thereto. An up signal U or a down signal D output from phase comparator 2 is supplied to locked detection circuit 8. Locked detection circuit 8 detects the locked state of PLL circuit 10 according to the up and down signals U and D to provide the detection result.

This conventional locked detection circuit 8 had a problem that the performance evaluation of a semiconductor circuit such as a LSI including a PLL circuit could not be carried out accurately prior to shipment of that semiconductor circuit because the jitter level which prevents accurate locking of an internal clock signal could not be identified.

SUMMARY OF THE INVENTION

An object of the present invention is to improve accuracy of performance evaluation of a semiconductor circuit including phase lock function.

Another object of the present invention is to allow evaluation of the jitter level in a phase locked loop circuit.

A further object of the present invention is to carry out operation testing of a semiconductor circuit having a function to evaluate the performance of a semiconductor circuit provided with a phase lock function per se.

A semiconductor circuit according to the present invention is a semiconductor circuit provided with phase lock function, including a semiconductor chip, a phase locked loop circuit, and an evaluation circuit.

The phase locked loop circuit is formed on the semiconductor chip to compare the phases of an input signal and a feedback signal for providing a pulse signal having a pulse width according to the phase difference.

The evaluation circuit is formed on the semiconductor chip to provide an evaluation signal of the phase locked loop circuit according to the pulse signal.

According to the present invention, the phase locked loop circuit and the evaluation circuit are formed on the same semiconductor chip, and the evaluation circuit evaluates the performance of the phase locked loop circuit according to a pulse signal provided from the phase locked loop circuit. Therefore, the performance evaluation accuracy can be improved of a semiconductor circuit having a phase lock function.

A semiconductor circuit according to another aspect of the present invention is a semiconductor circuit having a phase lock function formed on a semiconductor chip, including a phase locked loop circuit, a plurality of signal extracting circuits, a plurality of determination circuits and an evaluation signal output circuit.

The phase locked loop circuit includes a phase comparison circuit for comparing the phases of an input signal and a feedback signal to provide a pulse signal of a pulse width according to the phase difference. The plurality of signal extracting circuits each receiving the pulse signal to extract a pulse signal having a pulse width exceeding a corresponding predetermined pulse width.

The plurality of determination circuits are provided corresponding to the plurality of signal extracting circuits. Each determination circuit counts the pulse signal extracted at a corresponding signal extracting circuit to make determination whether the count result within a predetermined time period has reached a predetermined number. The evaluation signal output circuit provides an evaluation signal of the phase locked loop circuit according to the determination results of the plurality of determination circuits.

By setting the pulse width of a pulse signal to be extracted in each signal extracting circuit to a value such that the jitter generated in the phase locked loop circuit can be detected in a level of a plurality of stages in the signal extracting circuit, the level of the jitter in the phase locked loop circuit can be evaluated if the determination circuit having the count result reaching a predetermined number can be identified according to an evaluation signal from the evaluation signal output circuit. Thus, the performance evaluation accuracy of a semiconductor circuit having phase lock function can be improved.

A semiconductor circuit according to a further aspect of the present invention is a semiconductor circuit formed on a semiconductor chip and having a phase locked function, including a phase locked loop circuit, a signal selection circuit, a plurality of signal extracting circuits, a plurality of determination circuits, and an evaluation signal output circuit.

The phase locked loop circuit includes a phase comparison circuit for comparing the phases of an input signal and a feedback signal to provide a pulse signal having a pulse width according to the phase difference. The signal selection circuit receives the pulse signal, a predetermined test pulse signal and a mode signal for selectively providing either the pulse signal or the test pulse signal according to the mode signal.

The plurality of signal extracting circuits each receiving pulse signals provided from the signal selection circuit to extract a pulse signal having a pulse width exceeding a corresponding predetermined pulse width. The plurality of determination circuits are provided corresponding to the plurality of signal extracting circuits. Each determination circuit counts the pulse signal extracted by a corresponding signal extracting circuit to determine whether the count result within a predetermined time period reaches a predetermined number. The evaluation signal output circuit provides an evaluation signal of the phase locked loop circuit according to the determination results of the plurality of determination circuits.

Because a test pulse signal can be supplied to each signal extracting circuit by the signal selection circuit, operation testing of the signal extracting circuit, the determination circuit, and the signal evaluation output circuit can be carried out.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

An embodiment of the present invention will be described hereinafter with reference to the drawing.

Figure 1:
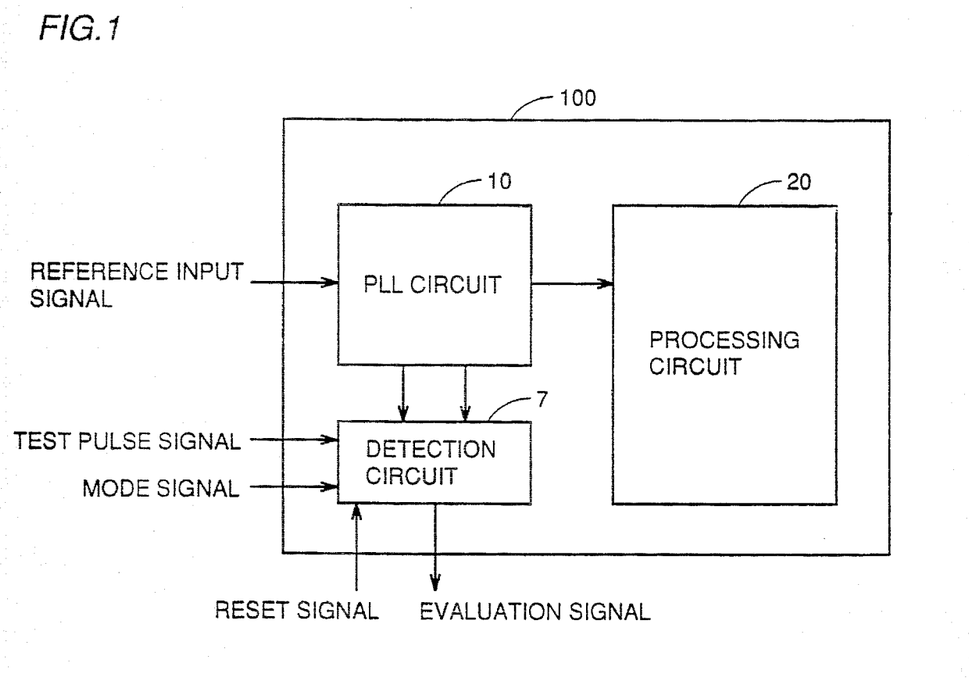
FIG. 1 is a circuit diagram of a semiconductor device forming a semiconductor circuit.

FIG. 1 is a circuit diagram of a semiconductor chip in which a semiconductor circuit of the present invention is formed. Referring to FIG. 1, a semiconductor chip 100 includes a PLL (Phase Locked Loop) circuit 10, a detection circuit 7 and a processing circuit 20. PLL circuit 10 is supplied with a reference input signal (external clock signal) which becomes the reference value of the phase of an internal clock signal provided to processing circuit 20. PLL circuit 10 has the phase of the internal clock signal controlled so that the phase of the internal clock signal matches that of the reference input signal.

The signal for phase control (up signal U and down signal D) of PLL circuit 10 is provided to detection circuit 7. Detection circuit 7 is also supplied with a test pulse signal, a mode signal, and a reset signal. Detection circuit 7 detects the locked state of PLL circuit 10 and the level of jitter according to an up signal U, a down signal D, and a reset signal. Furthermore, an operation test of detection circuit 7 is carried out according to a test pulse signal supplied according to a mode signal, and a reset signal. The detection result of detection circuit 7 is provided outside semiconductor chip 100.

Figure 2:
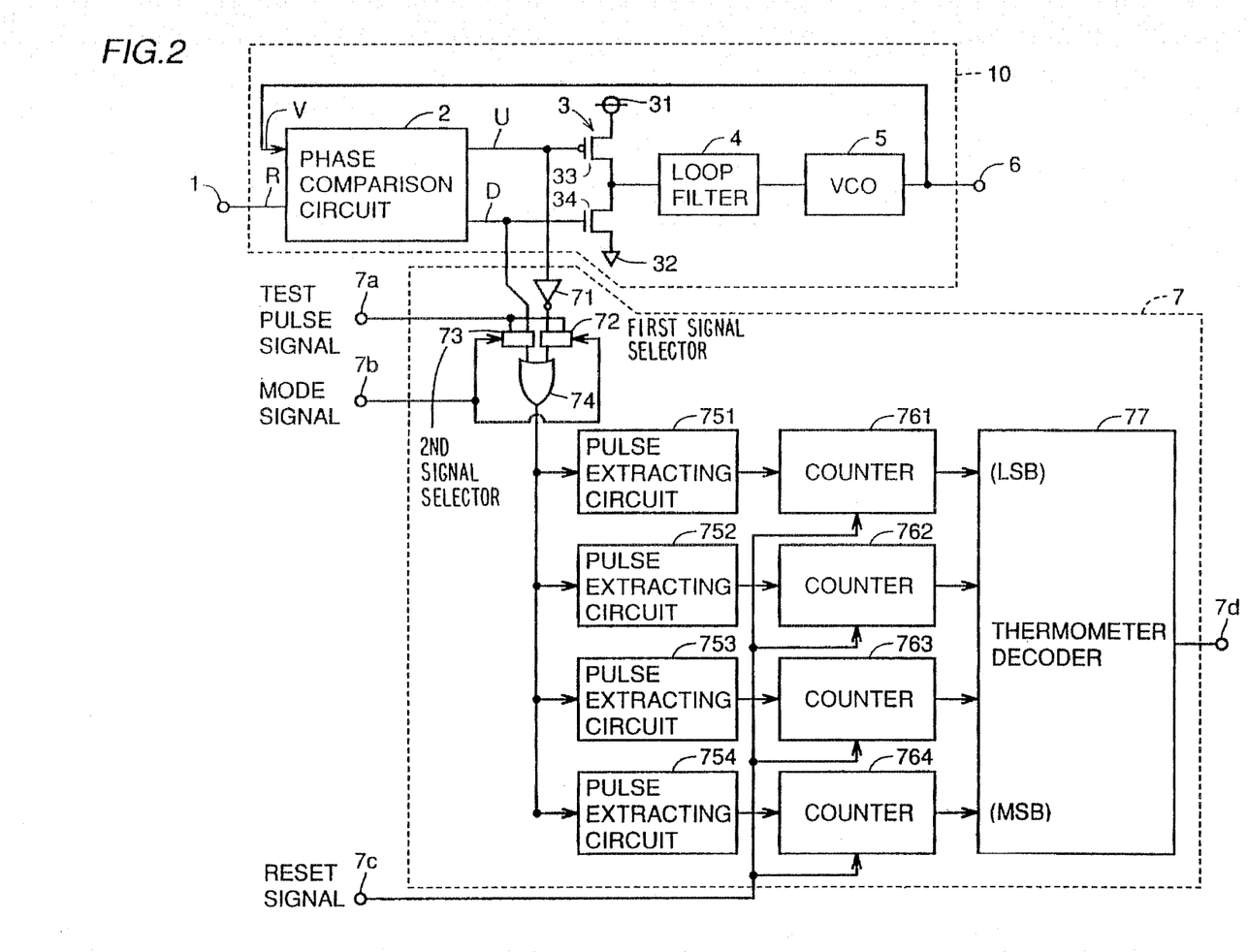
FIG. 2 is a block diagram showing a structure of a semiconductor circuit.

FIG. 2 is a block diagram showing a structure of the semiconductor circuit of the present invention.

The structures of PLL circuit 10, charge pump 3, and loop filter 4 are similar to those already described with reference to FIG. 11, and their description will not be repeated.

The structure of detection circuit 7 is as follows.

Up signal U is supplied to a first signal selector 72 via an inverter 71. Down signal D is directly supplied to a second signal selector 73. First and second signal selectors 72 and 73 are supplied with a test pulse signal from input terminal 7a and a mode signal from input terminal 7b.

First signal selector 72 supplies an up signal U inverted in inverter 71 and a test pulse signal to a first input terminal of an OR gate 74 when the mode signal attains a low level and a high level, respectively. Second signal selector 73 supplies a down signal D and a test pulse signal to a second input terminal of OR gate 74 when the mode signal attains a low level and a high level, respectively.

The output signal of OR gate 74 is respectively supplied to pulse extracting circuits 751, 752, 753, 754. Pulse extracting circuits 751-754 serve to extract a pulse signal having a pulse width greater than a predetermined pulse width. The respective pulse widths of a pulse signal to be extracted by the pulse extracting circuits are set to a greater value in the order of pulse extracting circuits 751, 752, 753, 754. Thus, pulse extracting circuits 751–754 respectively extract jitters of different pulse widths. A pulse signal extracted by pulse extracting circuits 751–754 is supplied to counters 761–764, respectively. Each of counters 761–764 is supplied with a reset signal provided from an input terminal 7c. This reset signal is input at a predetermined period.

Counters 761–764 respectively count the pulse signal extracted by corresponding pulse extracting circuits 751–754 to make determination whether the count result reaches a predetermined number within 1 input period of a reset signal. When the count result reaches a predetermined number, a signal of a high level is supplied to thermometer decoder 77 during the input period of the next reset signal.

Thermometer decoder 77 decodes the input signals from counters 761–764 which are provided from an output terminal 7d as an evaluation signal for evaluating jitter of PLL circuit 10 or a signal representing the locked state of PLL circuit 10.

The operation of a semiconductor circuit of the above-described structure is as follows. When there is a phase difference between reference input signal R and feedback signal V in phase comparison circuit 2, PLL circuit 10 provides a up signal U or a down signal D from phase comparison circuit 2 to solve the phase difference. When up signal U attains a low level, PMOS transistor 33 is turned on to bring the voltage pulse provided from charge pump 3 to a high level. As a result, VC0 5 raises the oscillation frequency to advance the phase of the output signal. When down signal D attains a high level, NMOS transistor 34 is turned on to bring the voltage pulse provided from charge pump 3 to a low level. As a result, VC0 5 lowers the oscillation frequency to delay the phase of the output signal. Thus, the phase of an output signal is controlled in PLL circuit 10.

In the case where the mode signal attains a low level, detection circuit 7 has a pulse signal supplied to pulse extracting circuits 751–754 when up signal U attains a low level or down signal D attains a high level by the selection operation of first and second signal selectors 72 and 73 and the operation of OR gate 74.

When a pulse signal is input, pulse extracting circuits 751–754 extract a pulse signal according to the respective specified pulse width. The extracted pulse signal is supplied to counters 761–764. When the count value of a supplied pulse signal exceeds a predetermined number during 1 reset period in counters 761–764, a signal of a high level is supplied to thermometer decoder 77.

Thermometer decoder 77 converts the logic signals provided from each of counters 761–764 into binary data for output. The binary data represents information indicating which counter has an output of a high level. Since pulse extracting circuits 751–754 are set so that jitters of different width are extracted, the level of the jitter can be identified from the specified value of the pulse width if the counter having an output of a high level is identified. Thus, the level of a jitter in PLL circuit 10 can be evaluated by the binary data.

The detailed structure of each component in the semiconductor circuit of the present invention will be described hereinafter.

Figure 3:
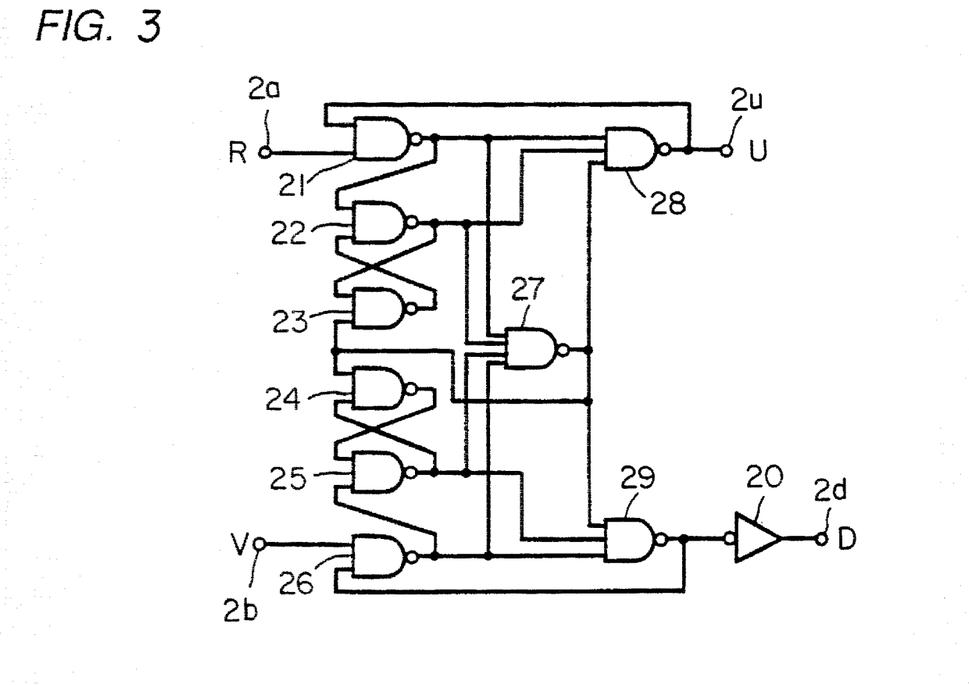
FIG. 3 is a circuit diagram showing a structure of a phase comparison circuit.

FIG. 3 is a circuit diagram showing a structure of phase comparison circuit 2. Referring to FIG. 3, phase comparison circuit 2 includes NAND gates 21–26 of 2 inputs, NAND gates 28 and 29 of 3 inputs, an NAND gate 27 of 4 inputs, and an inverter 20. Reference input signal R is input via a first input terminal 2a, and feedback signal V is input via a second input terminal 2b. Up signal U is provided from a first output terminal 2u, and a down signal D is provided from a second output terminal 2d.

Figure 4A:
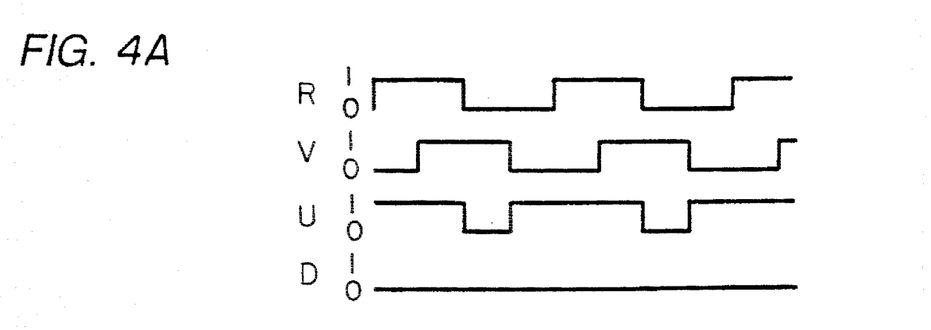
FIG. 4A is a timing chart showing the operation of a phase comparison circuit.
Figure 4B:
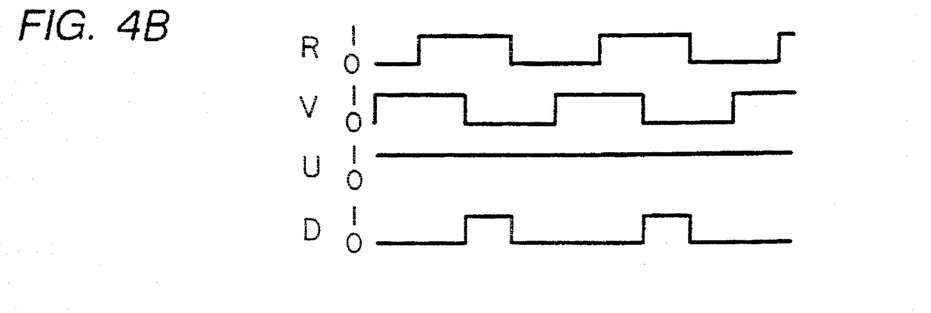
FIG. 4B is a timing chart showing the operation of a phase comparison circuit.

The operation of phase comparison circuit 2 will be described hereinafter. FIG. 4A and FIG. 4B are timing charts showing the operation of this phase comparison circuit 2. FIG. 4A shows the operation when the phase of feedback signal V is delayed with respect to the phase of reference input signal R. FIG. 4B shows the operation when the phase of feedback signal V is advanced with respect to the phase of reference input signal R. When the phase of feedback signal V is advanced, the fall of reference input signal R causes up signal U to attain a low level, and the fall of feedback signal V causes up signal U to attain a high level, as shown in FIG. 4A. More specifically, up signal U attains a low level corresponding to the delay of the phase. When the phase of reference input signal R is advanced, the fall of feedback signal V causes down signal D to attain a high level, and the fall of reference input signal R causes down signal D to attain a low level, as shown in FIG. 4B. More specifically, down signal D attains a high level corresponding to the advance of the phase.

Figure 5:
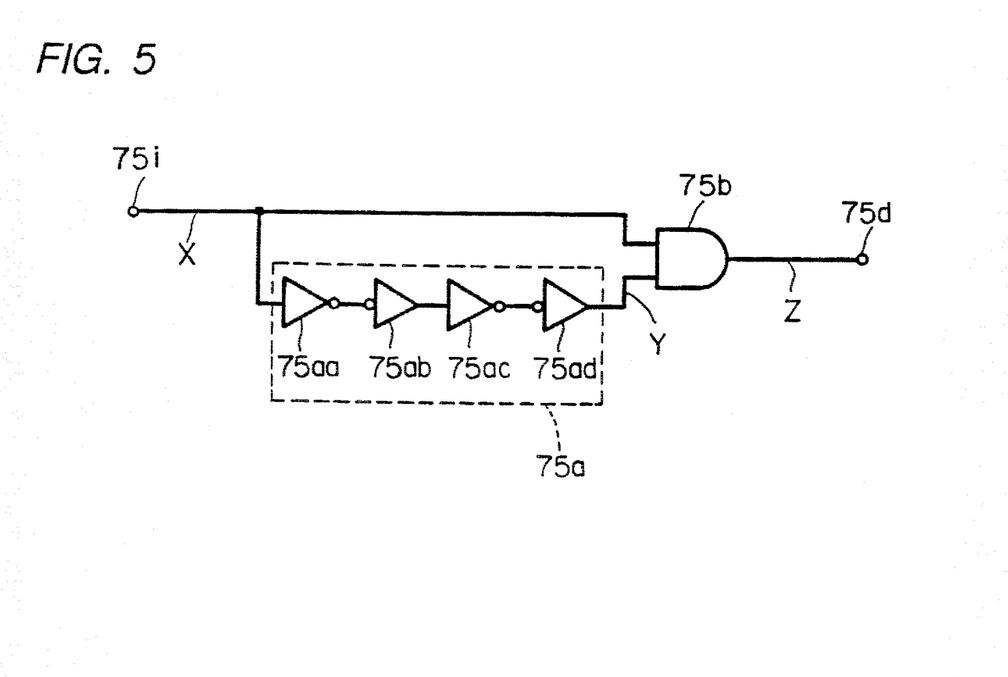
FIG. 5 is a circuit diagram showing a structure of a pulse extracting circuit.

FIG. 5 is a circuit diagram showing the structure of each of pulse extracting circuits 751–754. Referring to FIG. 5, an input terminal 75i is connected to a first input terminal of an AND gate 75b. Input terminal 75i is connected to a second input terminal of AND gate 75b via an inverter chain 75a including inverters 75aa, 75ab, 75ac, and 75ad connected in series. The output terminal of AND gate 75b is connected to output terminal 75d.

Figure 6:
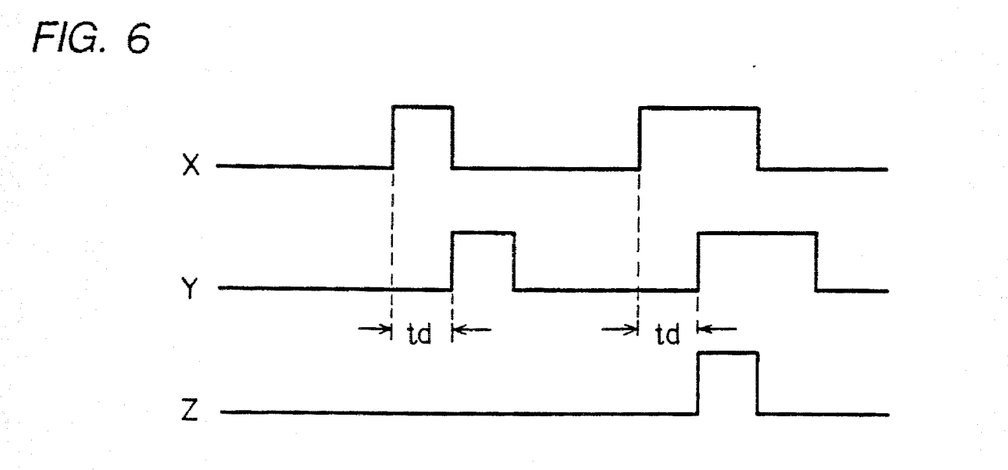
FIG. 6 is a timing chart showing an operation of a pulse extracting circuit.

The operation of pulse extracting circuits 751–754 of the above-described structure is as follows. FIG. 6 is a timing chart showing the operation of one of pulse extracting circuits 751–754. Referring to FIG. 6, a pulse signal X input from input terminal 75i, an output Y of inverter chain 75a, and an output Z of AND gate 75b are shown. Output Y attains a high level delayed by a delay time of td of inverter chain 75a from pulse signal X. Output Z attains a high level only during the time period when pulse signal X and output Y both attain a high level. Thus, each of pulse extracting circuits 751–754 provides a pulse signal of output Z only when the pulse width of pulse signal X is greater than delay time td of inverter chain 75a.

Figure 7:
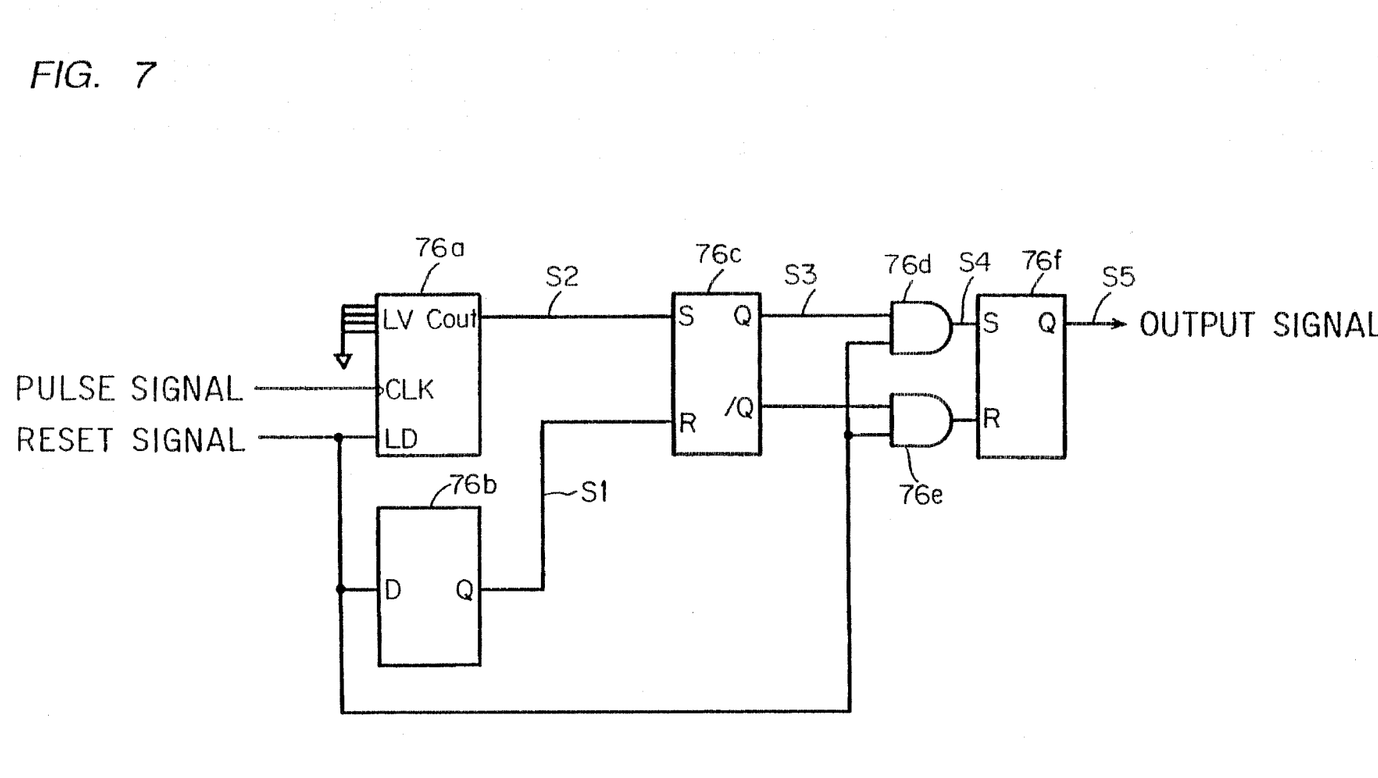
FIG. 7 is a circuit diagram showing a structure of a counter.

FIG. 7 is a circuit diagram showing the structure of counters 761–764. Referring to FIG. 7, a counter 76a is a 4-bit counter. A pulse signal which is an output of a pulse extracting circuit is supplied to a clock signal input terminal CLK, and a reset signal is supplied to an input terminal LD. An output terminal Cout of counter 76a is connected to a set input terminal S of a RS flipflop circuit 76c. All the load values LV of counter 76a are set to 0. When a reset signal is entered, the count value becomes 0.

D flipflop circuit 76b has a reset signal supplied to an input terminal D. The output terminal Q of D flipflop circuit 76b is connected to reset input terminal R of an RS flipflop circuit 76c. RS flipflop circuit 76c has an output terminal Q connected to the first input terminal of an AND gate 76d and its inverse output terminal /Q connected to the second input terminal of an AND gate 76e.

A reset signal is supplied to the respective second input terminals of AND gates 76d and 76e. AND gate 76d has its output terminal connected to set input terminal S of RS flipflop circuit 76f. AND gate 76e has its output terminal connected to reset input terminal R of RS flipflop circuit 76f. RS flipflop circuit 76f has its output terminal Q connected to the input terminal of thermometer decoder 77.

Figure 8:
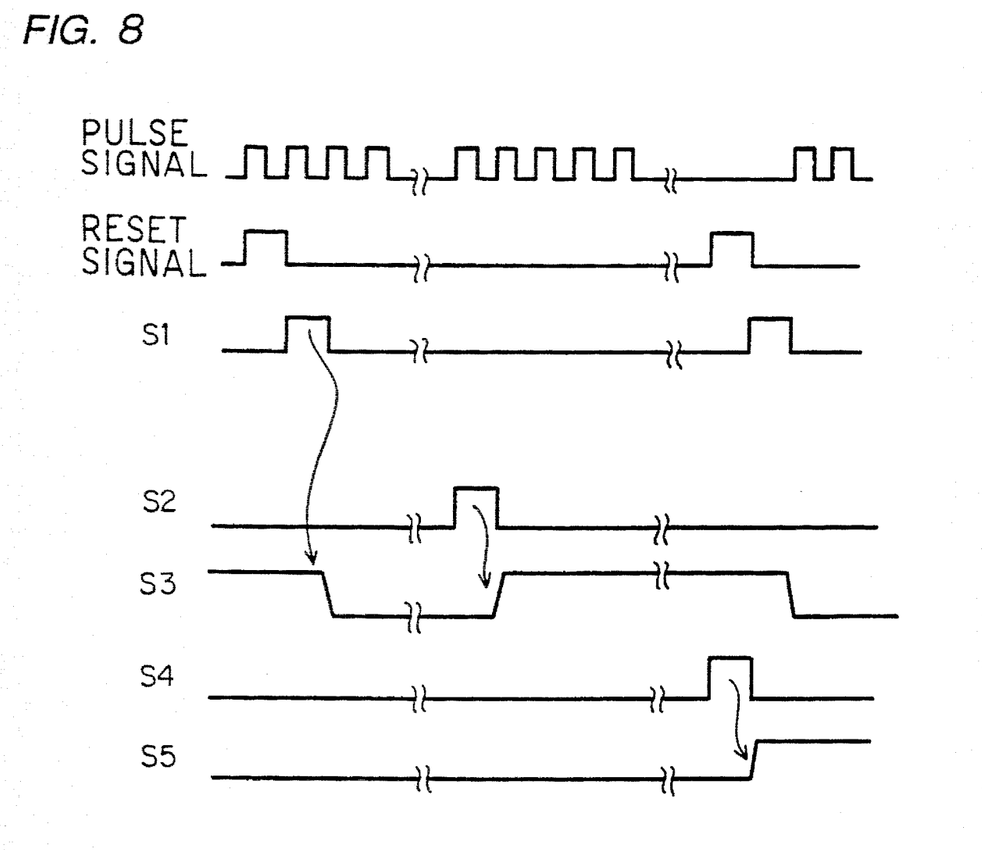
FIG. 8 is a timing chart showing an operation of a counter.

Counters 761–764 operate as follows. FIG. 8 is a timing chart of the operation of counters 761–764, showing a pulse signal, a reset signal, an output S1 of output terminal Q of D flipflop circuit 76b, an output S2 of output terminal Cout of counter 76a, an output S3 of output terminal Q of RS flipflop circuit 76c, an output S4 of AND gate 76d, and an output S5 of output terminal Q of RS flipflop circuit 76f.

When a reset signal is input, the count of a pulse signal is initiated at counter 76a. When output S1 of D flipflop circuit 76b attains a high level, output S3 of RS flipflop circuit 76c falls and is maintained at the low level. In this state, output S4 of AND gate 76d and output S5 of RS flipflop circuit 76f attain a low level.

When counter 76a counts a pulse signal of a predetermined number, output S2 of counter 76a attains a high level for a predetermined time. Output S3 of RS flipflop circuit 76c is pulled to a high level and maintains that state.

Then, when a subsequent reset signal is input, both inputs of AND gate 76d attain a high level, whereby output S4 of AND gate 76d attains a high level only during the continuation of that reset signal. As a result, output S5 of RS flipflop circuit 76f rises to maintain its high level. Simultaneously, the count value of counter 76a is cleared by an input of a reset signal, whereby output S1 attains a high level for a predetermined time. Then, output S3 of RS flipflop circuit 76c falls to a low level. The above-described operation is repeated.

Thus, when a predetermined number of pulse signals are input during 1 input period of a reset signal, output S5 attains a high level during the period of the next reset signal. When a pulse signal does not exceed a predetermined number during 1 period of an input of a reset signal, S5 will attain a low level during the period of the next reset signal because output S2 does not attain a high level.

Figure 9:
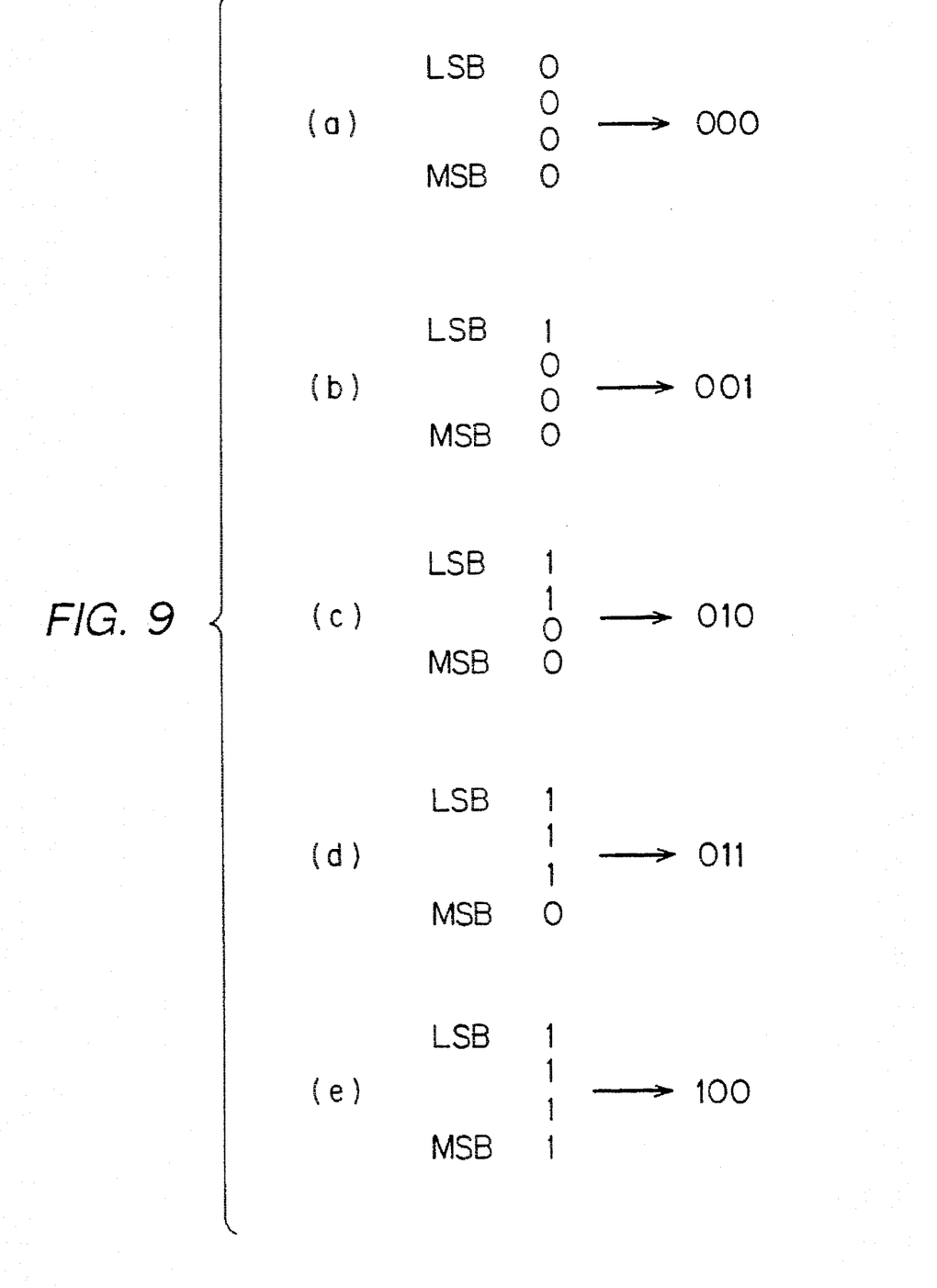
FIG. 9 shows the conversion of an evaluation signal in a thermometer decoder.

The operation of thermometer decoder 77 is described hereinafter. The conversion state of an evaluation signal in thermometer decoder 77 is shown in (a)–(e) in FIG. 9. In FIG. 9, signals provided from counters 761–764 are represented corresponding to the least significant bit LSB to the most significant bit MSB, and show their conversion into binary numbers indicated at the respective tips of the arrows in the drawing. More specifically, the number of input signals from the least significant bit LSB to the most significant bit MSB attaining a high level (1) are represented in binary number.

When all input signals attain a low level (0), the evaluation signal is represented as 000 as shown in FIG. 9 (a). When only the input signal of the least significant bit LSB attains a high level (1), the evaluation signal is represented as 001 as shown in FIG. 9 (b). When the input signals of the less significant 2 bits attain a high level (1), the evaluation signal becomes 010 as shown in FIG. 9 (c). When the input signals of the less significant 3 bits attain a high level (1), the evaluation signal becomes 011. When all the input signals attain a high level (1), the evaluation signal becomes 100.

Figure 10:
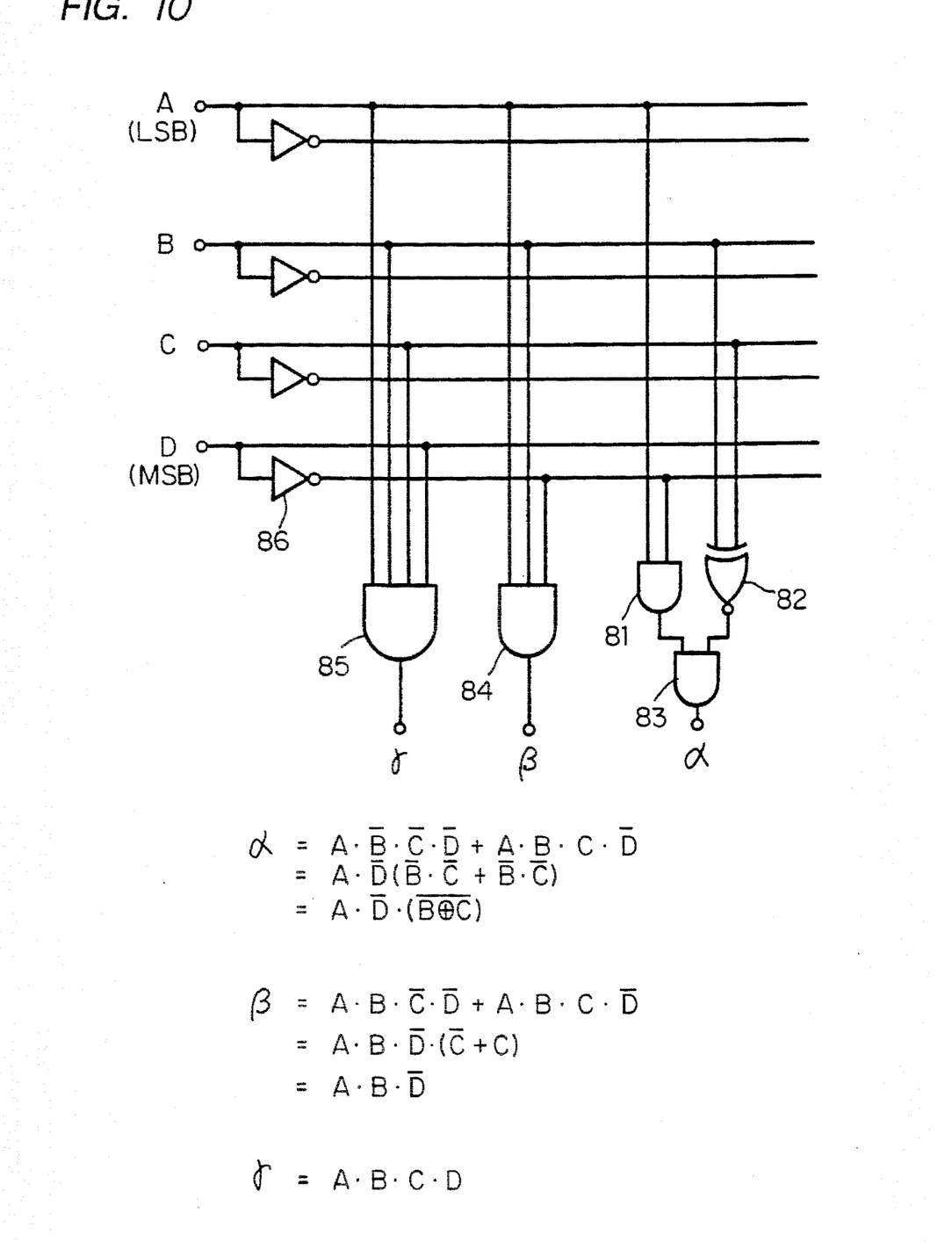
FIG. 10 is a circuit diagram showing an example of a structure of a thermometer decoder.

An obtained evaluation signal represents up to which of counters 761–764 their outputs signals attain a high level. Because the extraction width of a pulse signal of a pulse extracting circuit corresponding to that counter is determined in advance, the level of jitter in the PLL circuit can be detected according to the evaluation signal provided from thermometer decoder 77. A structure of such a thermometer decoder is shown in FIG. 10. Referring to FIG. 10, input signals to thermometer decoder 77 are represented by A (LSB)–D (MSB), and the evaluation signals are represented by a binary number of ($\gamma, \beta, \alpha$).

$\alpha$ is obtained by an AND gate 81 ANDing input signal A and an inverted signal of input signal D (via inverter 86), an exclusive NOR gate 82 taking the exclusive logical NOR between input signal B and input signal C, and an AND gate 83 ANDing the two outputs.

$\beta$ is obtained by an AND gate 84 ANDing input signals A, B, and an inverted signal of input D.

$\gamma$ is obtained by an AND gate 85 ANDing input signals A, B, C and D. The appropriateness of the structure of these circuits is confirmed by the logical equation of $\alpha, \beta, \gamma$ shown in FIG. 10.

Because the above-described semiconductor circuit has the widths of the pulse signal extracted by pulse extracting circuits 751–754 specified such as to detect the jitter of PLL circuit 10, the level of the jitter can be evaluated according to the evaluation signal provided from thermometer decoder 77. Furthermore, if any of the pulse width of pulse extracting circuits 751–754 is set to a value that can detect an unlock state of a PLL signal of PLL circuit 10, detection of an unlock state can also be carried out.

Although the present embodiment is described in which 4 pulse extracting circuits and 4 counters are provided, the present invention is not limited to this number and may be increased.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor circuit having a phase lock function formed on a semiconductor chip, comprising:

phase locked loop means including phase comparison means for comparing the phases between an input signal and a feedback signal to provide a pulse signal having a pulse width according to the phase difference, a plurality of signal extracting means each receiving said pulse signal for extracting a pulse signal having a pulse width exceeding a corresponding predetermined pulse width, a plurality of determination means provided corresponding to said plurality of signal extracting means, each counting the pulse signal extracted by the corresponding signal extracting means to determine whether the count result within a first predetermined time period reaches a predetermined number, and evaluation signal output means for providing an evaluation signal of said phase locked loop means according to the determination results of said plurality of determination means.

2. The semiconductor circuit according to claim 1, wherein each of said plurality of signal extracting means comprises signal delaying means for delaying said pulse signal, and AND means for ANDing said pulse signal and the delayed pulse signal from said signal delaying means.

3. The semiconductor circuit according to claim 2, wherein said signal delaying means comprises a plurality of inverting means connected in series.

4. The semiconductor circuit according to claim 1, wherein each of said plurality of determination means comprises counting means for counting the pulse signal extracted by the corresponding signal extracting means to provide a signal when the count result within said first predetermined time period reaches said predetermined number, and state holding means for holding the level of the output signal of said counting means for a second predetermined time period.

5. The semiconductor circuit according to claim 1, wherein said evaluation signal output means comprises logic means for converting the determination results of said plurality of determination means into information specifying the determination means having a count result reaching said predetermined number to provide the conversion result as an evaluation signal.

6. A semiconductor circuit having phase lock function formed on a semiconductor chip, comprising:

phase locked loop means including phase comparison means for comparing the phases between an input signal and a feedback signal to provide a pulse signal having a pulse width according to the phase difference, signal selection means receiving said pulse signal, a predetermined test pulse signal and a mode signal for selectively providing one of said pulse signal and said test pulse signal according to the mode signal, a plurality of signal extracting means each receiving the pulse signal provided from said signal selection means for extracting a pulse signal having a pulse width exceeding a corresponding predetermined pulse width, a plurality of determination means provided corresponding to said plurality of signal extracting means, each counting the pulse signal extracted by the corresponding signal extracting means to determine whether the count result within a predetermined time period reaches a predetermined number, and evaluation signal output means for providing an evaluation signal of said phase locked loop means according to the determination results of said plurality of determination means.

7. A method of operating a semiconductor circuit having phase lock function, comprising the steps of:

comparing the phases between an input signal and a feedback signal to provide a pulse signal having a pulse width according to the phase difference, converting said pulse width into voltage, controlling the frequency of said feedback signal in response to said voltage produced by conversion, supplying said pulse signal to a plurality of signal extracting means each for extracting a pulse signal having a pulse width exceeding a corresponding predetermined pulse width, wherein the pulse widths of pulse signals to be extracted by said plurality of signal extracting means differ from each other, counting the pulse signal extracted by each of said plurality of signal extracting means for making determination whether the count result within a predetermined time period reaches a predetermined number, and providing an evaluation signal of said semiconductor circuit according to the determination results.

8. A method of operating a semiconductor circuit having phase lock function, comprising the steps of:

comparing the phases between an input signal and a feedback signal to provide a pulse signal having a pulse width according to the phase difference, converting said pulse width into voltage, controlling the frequency of said feedback signal in response to said voltage produced by conversion, receiving said pulse signal, a predetermined test pulse signal, and a mode signal for selectively providing one of said pulse signal and said test pulse signal according to the mode signal, supplying said selectively provided pulse signal to a plurality of signal extracting means each for extracting a pulse signal having a pulse width exceeding a corresponding predetermined pulse width, wherein the pulse widths of pulse signals to be extracted from said plurality of signal extracting means differ from each other, counting the pulse signal extracted by each of said plurality of signal extracting means for making determination whether the count result within a predetermined time period reaches a predetermined number, and providing an evaluation signal of said semiconductor circuit according to the determination results.

* * * * *